(12) United States Patent
Inoue et al.

(10) Patent No.: US 6,602,771 B2
(45) Date of Patent: Aug. 5, 2003

(54) METHOD FOR FABRICATING SEMICONDUCTOR DEVICE

(75) Inventors: Fumihiko Inoue, Kawasaki (JP); Masayuki Tanaka, Yokohama (JP)

(73) Assignees: Fujitsu Limited, Kawasaki (JP); Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/939,639

(22) Filed: Aug. 28, 2001

(65) Prior Publication Data
US 2002/0119648 A1 Aug. 29, 2002

(30) Foreign Application Priority Data
Dec. 27, 2000 (JP) ........................ 2000-397856

(51) Int. Cl.$^7$ ............................ H01L 21/3205
(52) U.S. Cl. ................................... 438/585
(58) Field of Search ................... 438/585, 591, 438/595, 791, 792

(56) References Cited

U.S. PATENT DOCUMENTS 6,137,156 A * 10/2000 Ichikawa et al. ............ 257/640
6,372,672 B1 * 4/2002 Kim et al. ................... 438/791

FOREIGN PATENT DOCUMENTS

| JP | 2000-12856 | 1/2000 |
| JP | 2000-58483 | 2/2000 |

OTHER PUBLICATIONS

J.R. Pfiester, et al. IEEE, Transactions on Electron Devices, vol. 37, No. 8, Aug. 1990, pp. 1842–1851.

* cited by examiner

*Primary Examiner*—David Nelms
*Assistant Examiner*—Quoc Hoang
(74) *Attorney, Agent, or Firm*—Armstrong, Westerman & Hattori, LLP

(57) ABSTRACT

The method for fabricating the semiconductor device comprises the step of: forming a gate insulation film 14 on a semiconductor substrate 10; forming a semiconductor layer 22 containing boron on the gate insulation film 14; forming a silicon nitride film 28 having an Si—H bond concentration in the film immediately after deposited which is below $4.3 \times 10^{20}$ cm$^{-3}$ measured by FT-IR; and patterning the silicon nitride film 28 and the semiconductor layer 22 to form a gate electrode 30 of a semiconductor layer 22 having the upper surface covered by the silicon nitride film 28. Whereby the release of hydrogen in the films in the thermal processing after the silicon nitride film has been formed can be decreased, and the boron penetration from the p-type gate electrode 30p can be suppressed.

12 Claims, 8 Drawing Sheets

METHOD FOR FABRICATING SEMICONDUCTOR DEVICE

BACKGROUND OF THE INVENTION

The present invention relates to a method for fabricating a semiconductor device having a dual gate electrode, more specifically to a method for fabricating a semiconductor device which can prevent boron penetration from a p-type gate electrode without degrading performance of an n-channel MOS transistor.

With the recent increasing micronization and higher-speed operation of semiconductor devices, the so-called dual gate electrode including a p-type gate electrode which is the gate electrode of a p-channel MOS transistor doped with an acceptor impurity, and an n-type gate electrode which is the gate electrode of an n-channel MOS transistor doped with a donor impurity has been increasingly used. In the p-type gate electrode, boron (B) is widely used as a dopant. However, because of the large diffusion coefficient in the silicon oxynitride film, the thermal diffusion that thermal processing in a later step causes boron in the gate electrode to diffuse through the gate insulation film into the silicon substrate in the channel region is a problem. When the boron penetration is occurred, an impurity concentration in the silicon substrate of the channel region changes to cause characteristic degradation, as of varying a threshold voltage, lowering the impurity concentration in the gate electrode to deplete the gate electrode, or others. It is preferable to reduce the born penetration as much as possible.

On the other hand, in the processing for opening a contact hole in a narrow region between gate electrodes, the so-called self-aligned contact (SAC) technique is widely used from the viewpoint of ensuring an alignment margin for the lithography. In the SAC technique, the side surface and the upper surface of the gate electrodes are covered with a silicon nitride film having etching selectivity with respect to a silicon oxide film, which is widely used as an inter-layer insulation film, and the inter-layer insulation film is etched with the silicon nitride film as a stopper to thereby open the contact hole arriving at the substrate without exposing the gate electrodes in the contact hole. In the SAC technique, the silicon nitride film is thus formed on the gate electrodes. However, it is reported that thermal processing following the formation of the silicon nitride film on the p-type gate electrodes enhances the born penetration (see, e.g., J. R. Pfiester et al., IEEE Trans. Electron Devices, vol. 37, 1842 (1990)).

As described above, the boron penetration from the p-type gate electrode is conspicuous in case of forming a silicon nitride film on the gate electrodes especially by the SAC technique. A technique for preventing the boron penetration from the p-type gate electrode is required.

It is known that the boron penetration from the p-type gate electrode is reduced by introducing nitrogen in the gate insulation film. The gate insulation film is formed by using NO or $N_2O$, or thermal processing is made in a gas atmosphere of NO, $N_2O$ or $NH_3$ after the gate insulation film has been formed, whereby a gate oxide film of a silicon oxynitride film containing nitrogen by about 10% is formed to prevent the boron penetration. However, in a case that the gate insulation film is formed of a silicon oxynitride film, the incorporated nitrogen is segregated in the interface between the silicon substrate and the gate insulation film, and surface state increase, which is result in lowering driving performance of the n-channel MOS transistors. Furthermore, increased nitrogen concentration increases fixed charges in the film, and an accordingly larger channel dose of the n-channel MOS transistor is necessary, often with results that the performance of the transistor has been degraded, and dopant concentration increase in the substrate has increased junction leakage current.

The Japanese Patent Application Laid-Open Publication No. 2000-12856, for example, discloses a technique of setting a temperature of thermal processing made after a silicon nitride film has been formed to be below a temperature at which can be prevented from the enhanced diffusion of boron. However, in order to prevent the enhanced diffusion of boron a temperature of thermal processing following the formation of the silicon nitride film must be set to be below about 900° C. The thermal processing at such low temperature is not sufficient to activate the source/drain diffusion, with a result of lower driving performance of the transistor.

As described above, in the conventional method for fabricating the semiconductor device, the prevention of the boron penetration from the p-type gate electrode degrades driving performance of the n-channel MOS transistor. A technique which can prevent the boron penetration from the p-type gate electrode without degrading performance of the n-channel MOS transistor has been required.

SUMMARY OF THE INVENTION

It is an object of the present invention to provide a method for fabricating the semiconductor device including a dual gate electrode which can prevent the boron penetration from the p-type gate electrode without lowering performance of the n-channel MOS transistor.

According to one aspect of the present invention, there is provided a method for fabricating the semiconductor device comprising the steps of: forming a gate insulation film on a semiconductor substrate; forming on the gate insulation film a conducting film including a semiconductor film containing boron as an acceptor impurity in at least one region; forming on the conducting film an insulation film including a silicon nitride film having an Si—H bond concentration immediately after deposited, which is below $4.3 \times 10^{20}$ cm$^{-3}$ measured by FT-IR; and patterning the insulation film and the conducting film to form a gate electrode of the conducting film having the upper surface covered by the insulation film.

According to another aspect of the present invention, there is provided a method for fabricating the semiconductor device comprising the steps of: forming a gate insulation film on a semiconductor substrate; forming on the gate insulation film a conducting film including a semiconductor film containing boron as an acceptor impurity in at least one region; patterning the conducting film to form a gate electrode of the conducting film; and forming on the side wall of the gate electrode a sidewall insulation film including a silicon nitride film having an Si—H bond concentration immediately after deposited, which is below $4.3 \times 10^{20}$ cm$^{-3}$ measured by FT-IR.

According to the present invention, the silicon nitride film covering the upper surfaces and/or the side walls of the gate electrodes are deposited under conditions which allow an Si—H bond concentration in the silicon nitride film immediately after deposited to be below a $4.3 \times 10^{20}$ cm$^{-3}$ measured by FT-IR, whereby release of hydrogen in the films in the thermal processing after the silicon nitride films have been formed, and the boron penetration from the p-type gate electrode can be suppressed. Thus, in the p-channel MOS transistor a dopant concentration in the silicon substrate in the channel region is prevented from changing to resultantly deviate a threshold voltage, or a dopant concentration in the gate electrode is prevented from changing to resultantly deplete the gate electrode. Thus, characteristic degradation can be prevented. A nitrogen concentration in the silicon oxynitride film forming the gate insulation film can be lowered, whereby the boron penetration from the p-type gate electrode can be prevented without lower driving performance of the n-channel MOS transistor.

DETAILED DESCRIPTION OF THE INVENTION

The method for fabricating the semiconductor device according to the present invention is characterized in that the method comprising the steps of: forming a gate insulation film on a semiconductor substrate; forming on the gate insulation film a conducting film including a semiconductor film containing boron as an acceptor impurity in at least one region; forming on the conducting film an insulation film including a silicon nitride film having an Si–H bond concentration immediately after deposited, which is below $4.3 \times 10^{20}$ cm$^{-3}$ measured by FT-IR; and patterning the insulation film and the conducting film to form a gate electrode of the conducting film having the upper surface covered by the insulation film. The present invention is based on the phenomena found for the first time by the inventors of the present invention that Si—H bonds in the silicon nitride film are a main factor for causing enhanced diffusion of boron in the silicon nitride film.

The Japanese Patent Application Laid-Open Publication No. 58583/2000 discloses a technique for preventing the boron penetration from the gate electrode by making a hydrogen concentration in the silicon nitride film to be less than $1 \times 10^{21}$ cm$^{-3}$ concentration measured by SIMS analysis. However, the inventors of the present application have made earnest studies and made it evident for the first time that the boron penetration is not influenced simply by a hydrogen concentration in the silicon nitride film but is much related with bonding states of hydrogen atoms in the silicon nitride film. Results of the studies of the inventors of the present application will be described below.

Figure 1:
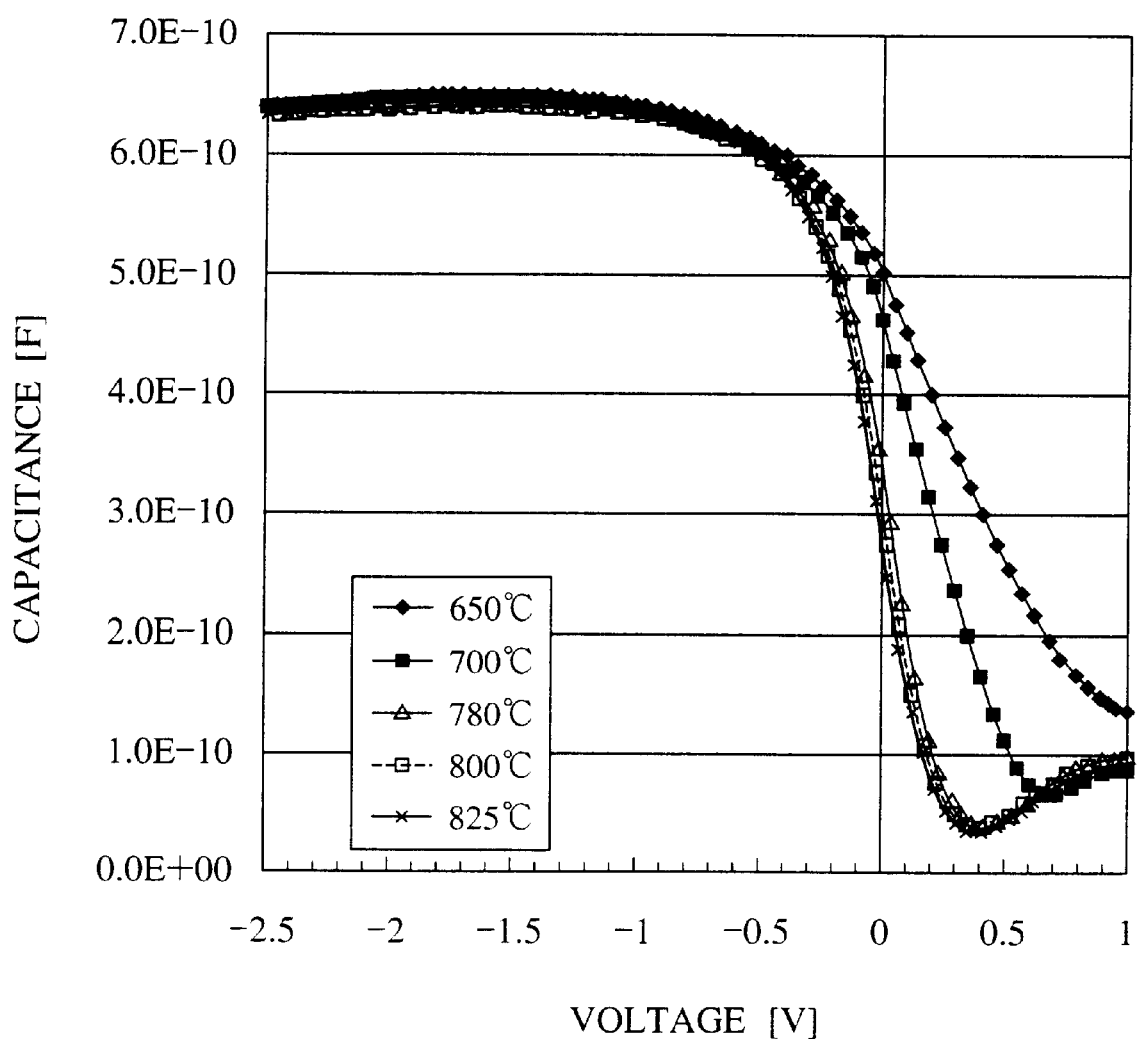
FIG. 1 is a graph of relationships between film forming temperatures for a silicon nitride film of a sample having the silicon nitride film formed on a gate electrode, and C-V characteristics.

FIG. 1 is a graph of relationships between film forming temperatures of a silicon nitride film on a gate electrode, and C-V characteristics. A gas flow rate ratio of NH$_3$/SiH$_2$Cl$_2$ for forming the silicon nitride film in FIG. 1 is 10. As shown, the C-V curves shift to the minus side as the film forming temperatures are higher, and it is seen that the boron penetration is smaller as the film forming temperatures of the silicon nitride film is higher. The C-V characteristics do not substantially change at the film forming temperatures of above 780° C. The silicon nitride film is formed at a film forming temperature of above 780° C., whereby the effect of preventing the boron penetration can be sufficiently exhibited.

Figure 2:
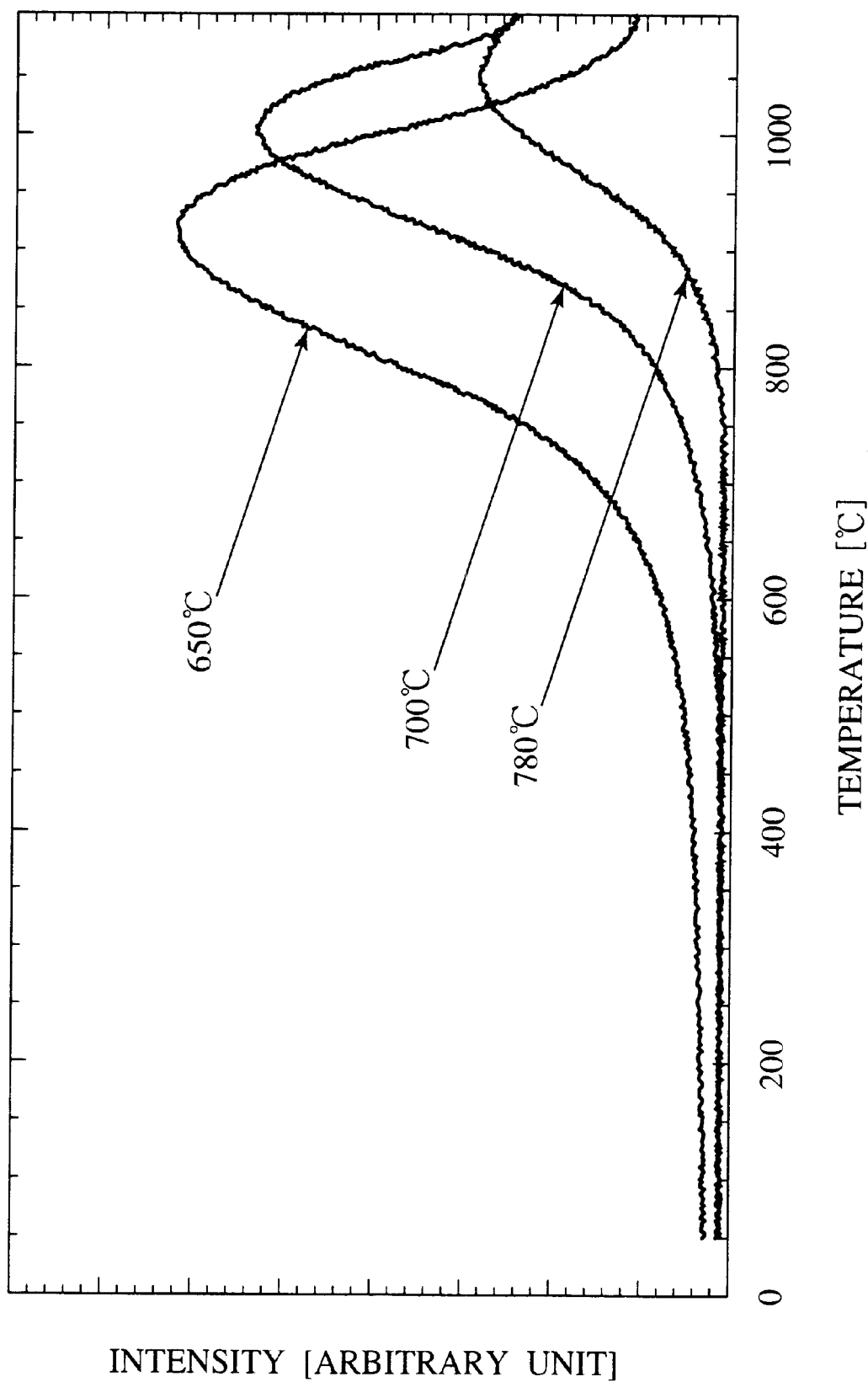
FIG. 2 is a graph of relationships between thermal processing temperatures after the silicon nitride film has been deposited and release amounts of hydrogen from the silicon nitride film.

FIG. 2 is a graph of relationships between thermal processing temperatures after the silicon nitride film has been deposited, and release amounts of hydrogen from the silicon nitride film. Three type of silicon nitride films with different deposition temperature are shown in the figure. In FIG. 2, the release amounts of hydrogen from the silicon nitride film were measured by Thermal Desorption Spectroscopy. As shown, as the silicon nitride film is formed at a lower temperature, a temperature for a peak value of the released hydrogen is lower, and also a hydrogen release amount is increased.

In connection with the result shown in FIG. 1, the result will show that when the silicon nitride film on the gate electrode is formed at a lower temperature, a large mount of hydrogen in the silicon nitride film is released by thermal processing after the deposition of the silicon nitride film, with a result that diffusion of boron in the gate electrode and the silicon oxynitride film is enhanced, and the boron penetration is enhanced. Accordingly, it is preferable that a temperature for a peak value of released hydrogen is higher than a heat processing temperature after the deposition of the silicon nitride film, and a release amount is small.

However, the boron penetration is not only influenced simply by a hydrogen concentration of the silicon nitride film, but also much related with a hydrogen bonding state in the silicon nitride film.

TABLE 1 shows relationships between hydrogen in the silicon oxynitride film and diffusion coefficients of boron in the silicon nitride film when the silicon nitride film is formed at 780° C. by using a raw material gas of NH$_3$ (ammonia) and SiH$_2$Cl$_2$ (dichlorosilane). In the Table 1, the Si—H bond and the N—H bond show peak values of FT-IR spectra. A total hydrogen amount in the film can be roughly given by a value of a combination of a peak value of the Si—H bonds and a peak value of the N—H bonds.

TABLE 1

| GAS FLOW RATE RATIO NH$_3$/SiH$_2$Cl$_2$ | PEAK INTENSITY MEASURED BY FT-IR | | DIFFUSION COEFFICIENT OF BORON IN SILICON OXYNITRIDE FILM |
|---|---|---|---|
| | Si—H BOND | N—H BOND | |
| 0.5 | 53 | 41 | 1.2E-16 |
| 5 | 15 | 117 | 5.7E-17 |
| 10 | 3.7 | 375 | 2.5E-17 |

As shown in TABLE 1, when a gas flow rate ratio between NH$_3$ and SiH$_2$Cl$_2$ (NH$_3$/SiH$_2$Cl$_2$) is changed, values of the Si—H bond and of the N—H bond in the silicon nitride film change. As a gas flow rate ratio becomes higher, the Si—H bond decreases, and the N—H bond increases. As a gas flow rate ratio becomes higher, a total amount of hydrogen in the film increases. In contrast to this, a diffusion coefficient of boron in the silicon oxynitride film decreases as a gas flow rate ratio becomes higher.

Thus, as a gas flow rate ratio is larger, a total amount of hydrogen in the silicon nitride film increases while a diffusion coefficient of boron in the silicon oxynitride film is smaller, which makes for the boron penetration difficult to occur. That is, the enhanced diffusion of boron will not be determined by a total amount of hydrogen in the silicon nitride film but will be decided by bonding states of hydrogen, more specifically will have correlationships with a total amount of Si—H bonds.

TABLE 2 shows relationships between film forming temperatures of the silicon nitride film, and concentration of Si—H bonds and N—H bonds in the silicon nitride film. The Si—H bond concentrations and the N—H bond concentrations were measured by FT-IR.

TABLE 2

| FILM FORMING TEMPERATURE | CONCENTRATION MEASURED BY FT-IR | |
|---|---|---|
| | Si—H BOND [cm$^{-3}$] | N—H BOND [cm$^{-3}$] |
| 825° C. | 1.3E20 | 4.2E21 |
| 800° C. | 2.7E20 | 4.2E21 |
| 780° C. | 4.3E20 | 4.4E21 |
| 700° C. | 7.8E20 | 6.0E21 |
| 650° C. | 2.1E21 | 4.3E21 |

As shown in TABLE 2, a concentration of the Si—H bond in the silicon nitride film also depends on a film forming temperature of the silicon nitride film. As a film forming temperature is higher, an Si—H bond concentration in the silicon nitride film decreases. In connection with the result of the C-V characteristics described above, a film forming temperature is set to be above 780° C., i.e., an Si—H bond concentration in the silicon nitride film measured by FT-IR is set to be below $4.3 \times 10^{20}$ cm$^{-3}$, whereby the boron penetration will be able to be prevented.

An amount of the Si—H bonds in the silicon nitride film is much related with the boron penetration. It has been made evident for the first time that as described above, an Si—H bond concentration in the silicon nitride film measured by FT-IR is set to be below $4.3 \times 10^{20}$ cm$^{-3}$, whereby the boron penetration will be able to be prevented.

Film forming conditions for setting an Si—H bond concentration in the silicon nitride film to be below $4.3 \times 10^{20}$ cm$^{-3}$ measured by FT-IR depend on kinds of raw material gases, fabrication equipments, etc. and cannot be uniformly determined. In the equipment used by the inventors of the present application, when $SiH_2Cl_2$ gas and $NH_3$ gas are used as raw material gases, a gas flow rate ratio ($NH_3/SiH_2Cl_2$) is set to be above 10, a film forming temperature is set to be above 780° C., and a pressure in the deposition chamber is to be above 40 Pa, whereby a Si—H bond concentration in the silicon nitride film can be controlled to be below $4.3 \times 10^{20}$ cm$^{-3}$ measured by FT-IR.

A raw material gas having less Si—H bond, e.g., $SiHCl_3$ is used in place of $SiH_2Cl_2$ gas, whereby an amount of the Si—H bonds in the silicon nitride film to be deposited can be further decreased, and the boron penetration can be much effectively prevented. With an Si—H amount in the film set to be the same, a film forming temperature can be lowered.

It is preferable that film forming conditions for the silicon nitride film are set suitably in accordance with raw material gases to be used and a fabrication equipment so that an Si—H bond concentration in the film immediately after deposited can be $4.3 \times 10^{20}$ cm$^{-3}$ measured by FT-IR.

Silicon nitride film is formed, in many cases, in a batch of 100 sheets, but because of a determined feed rate it is difficult to make the formed films homogeneous in the film forming, as described above, at above 780° C. using raw materials having a small amount of the Si—H bonds, such as $SiHCl_3/NH_3$ group. In such case, equipments of about 25 sheets-small batch or single-wafer type equipments are used so as to form homogeneous films.

[A First Embodiment]

The method for fabricating the semiconductor device according to a first embodiment of the present invention will be explained with reference to FIGS. 3A–3C, 4A–4C, 5A–5C, and 6A–6C.

FIGS. 3A–3C, 4A–4C, 5A–5C, and 6A–6C are sectional views of a semiconductor device in the steps of the method for fabricating the same according to the present embodiment, which show the method.

Figure 3A:
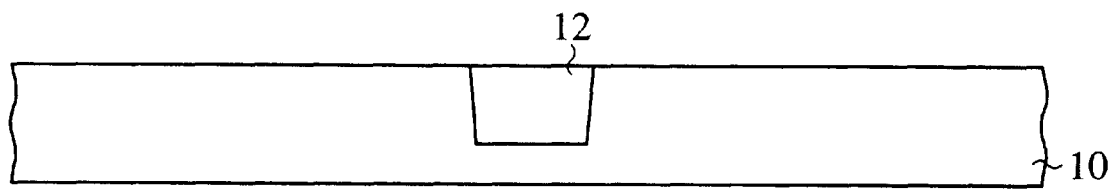
FIGS. 3A–3C, 4A–4C, 5A–5C, and 6A–6C are sectional views of a semiconductor device in the steps of the method for fabricating the same according to a first embodiment of the present invention, which show the method.

First, a device isolation film 12 of a silicon oxide film is formed in a silicon substrate 10 by, e.g., shallow trench isolation technique (FIG. 3A). In FIG. 3A, the region on the left side of the device isolation film 12 is a region for a p-channel MOS transistor to be formed in, and the region on the right side of the device isolation film 12 is a region for an n-channel MOS transistor to be formed in.

Next, a p-well (not shown) is formed as required in the region for an n-channel MOS transistor to be formed in, and an n-well (not shown) is formed as required in the region for a p-channel MOS transistor to be formed in. Ion implantation for controlling threshold voltages is performed in the respective regions for the transistors to be formed in.

Then, a silicon oxide film as a base film is formed in, e.g., an oxidizing atmosphere, and then thermal processing is performed at 900° C. in an NO atmosphere to form on the silicon substrate 10 defined by the device isolation film 12 a 4.5 nm-thick gate insulation film 14 of a silicon oxynitride film having a 3% nitrogen concentration.

Figure 3B:
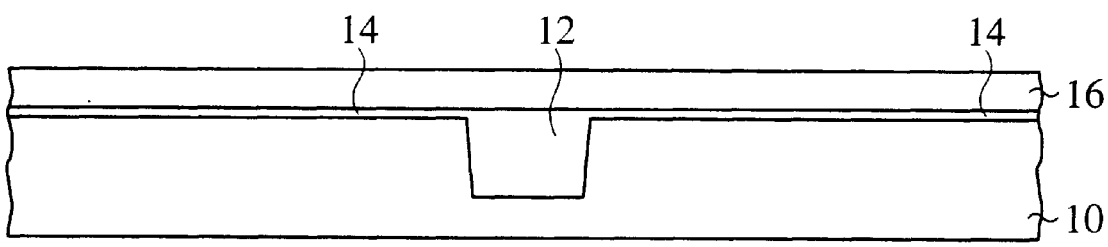

Next, a 70 nm-thick amorphous silicon film 16, for example, is formed on the gate insulation film 14 by, e.g., CVD method (FIG. 3B). The amorphous silicon film is formed at a 540° C. film forming temperature by, e.g., pyrolysis method using $SiH_4$ as a raw material gas.

Next, a photoresist film 18 for covering the region for an n-channel MOS transistor to be formed in is formed by the photolithography technique.

Figure 3C:
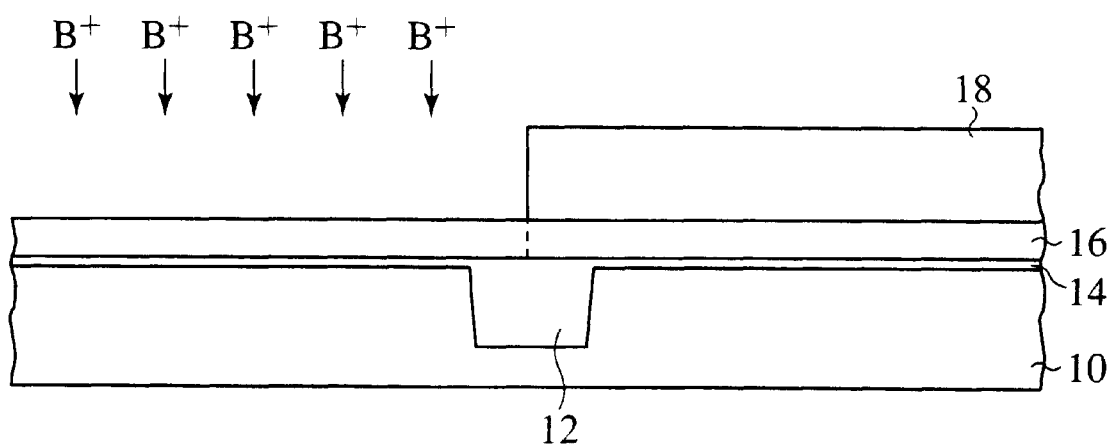

Then, with the photoresist film 18 as a mask, a p-type dopant ion is implanted into the amorphous silicon film 16 in the region for a p-channel MOS transistor to be formed in. For example, boron ions are implanted at 5 keV acceleration energy and a $1.5 \times 10^{15}$ cm$^{-2}$ dose (FIG. 3C).

Next, the photoresist film 18 is removed, and then a photoresist film 20 for covering the region for a p-channel MOS transistor to be formed in is formed by the photolithography technique.

Figure 4A:
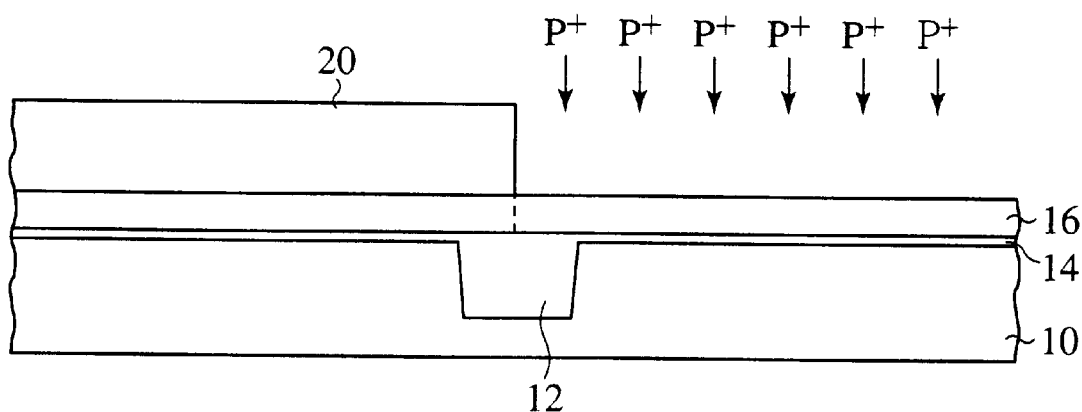

Then, with the photoresist film 20 as a mask, an n-type dopant ion is implanted into the amorphous silicon film 16 in the region for an n-channel MOS transistor to be formed in. For example, phosphorus (P) ions are implanted at 10 keV acceleration energy and a $5 \times 10^{15}$ cm$^{-2}$ dose (FIG. 4A).

Then, the photoresist film 20 is removed, and then thermal processing is performed, for example, for 30 minutes at 800° C. in a nitrogen atmosphere to crystallize the amorphous silicon film into a polycrystalline silicon film while activating the implanted boron and phosphorus, so as to transform the amorphous silicon film 16 in the region for a p-channel MOS transistor to be formed in to a p-type polycrystalline silicon film 22p and the amorphous silicon film 16 in the region for an n-channel MOS transistor to be formed in to an n-type polycrystalline silicon film 22n.

Then, a 5 nm-thick tungsten nitride (WN) film 24 and a 40 nm-thick tungsten (W) film 26 are sequentially deposited on the polycrystalline silicon films 22p, 22n by, e.g., sputtering method. The tungsten nitride film 24 is a barrier metal for preventing the reaction between the polycrystalline silicon film 22 and the tungsten film 26.

Figure 4B:
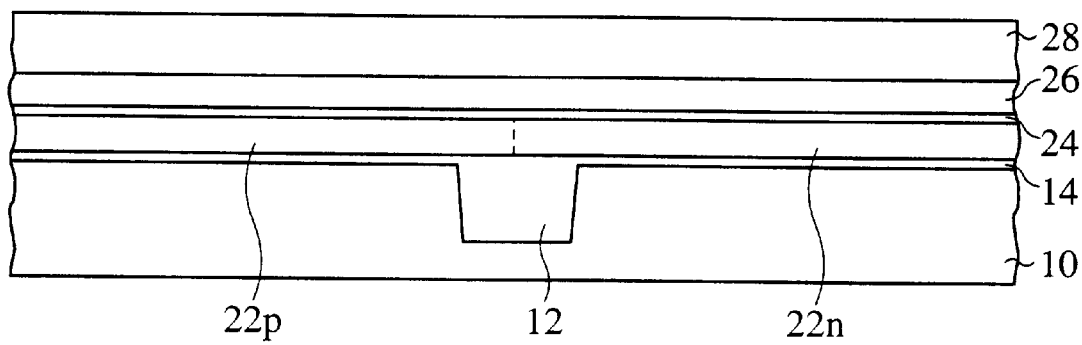

Next, a 100 nm-thick silicon nitride film 28 is formed on the tungsten film 26 by, e.g., CVD method (FIG. 4B). At this time, conditions for forming the film are set so that an Si—H bond concentration in the silicon nitride film 28 is below $4.3 \times 10^{20}$ cm$^{-3}$ measured by FT-IR. An Si—H bond concentration in the film can be below $4.3 \times 10^{20}$ cm$^{-3}$ measured by FT-IR by forming the film, e.g., at a 100 sccm SiH$_2$Cl$_2$ gas flow rate, a 1000 sccm NH$_3$ gas flow rate, a 780° C. film forming temperature and a 40 Pa pressure.

Figure 4C:
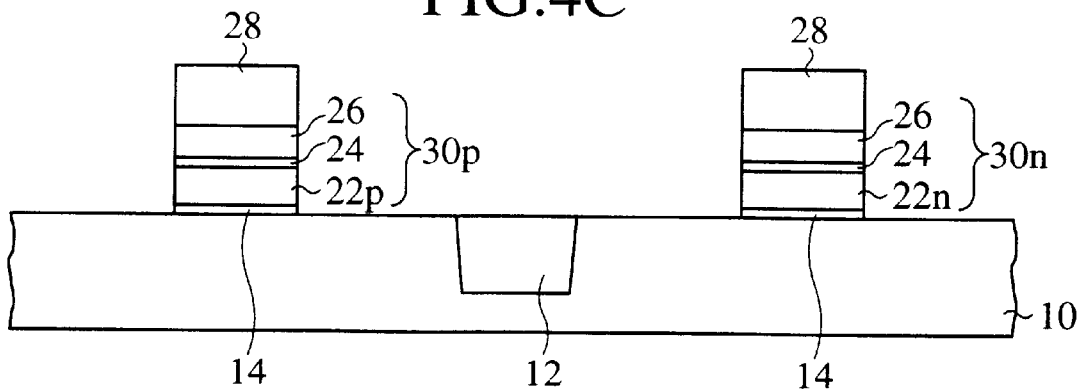

Then, the silicon nitride film 28, the tungsten film 26, the tungsten nitride film 24 and the polycrystalline silicon film 22p, 22n are patterned by the photolithography and etching to form in the region for a p-channel MOS transistor to be formed in a p-type gate electrode 30p of the so-called polymetal structure having the upper surface covered by the silicon nitride film 28 and formed of the layer structure of the polycrystalline silicon film 22p, the tungsten nitride film 24 and the tungsten film 26 and form in the region for an n-channel MOS transistor to be formed in an n-type gate electrode 30n of the polymetal structure having the upper surface covered by the silicon nitride film 28 and formed of the layer structure of the polycrystalline silicon film 22n the tungsten nitride film 24 and the tungsten film 26 (FIG. 4C).

Next, thermal processing is performed in an atmosphere containing, e.g., hydrogen and steam for 60 minutes at 800° C. to oxidize selectively only the side walls of the polycrystalline silicon films 22n, 22p without oxidizing the tungsten film 26 and the tungsten nitride film 24 to form a silicon oxide film 32.

Then, a photoresist film 34 for covering the region for an n-channel MOS transistor to be formed in is formed by the photolithography technique.

Figure 5A:
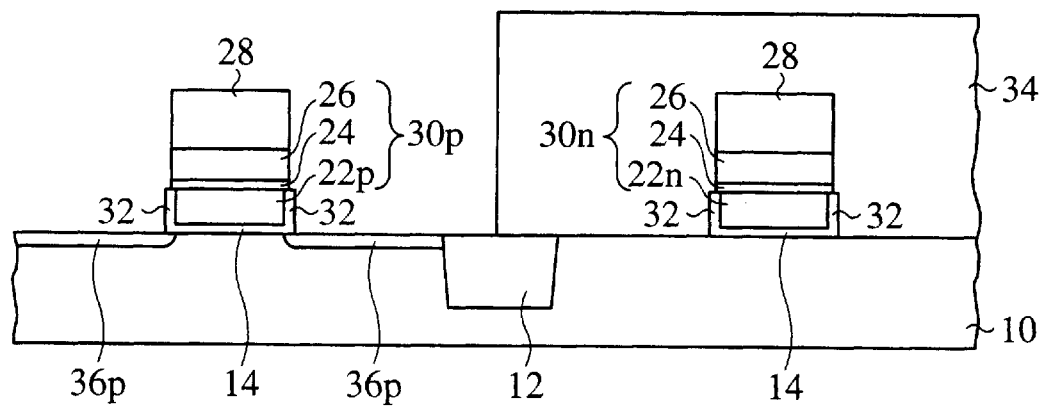

Then, with the photoresist film 34 and the gate electrode 30p as a mask, BF$_2$ ions are implanted at 15 keV acceleration energy and a $3 \times 10^{14}$ cm$^{-2}$ dose to form in the silicon substrate 10 on both sides of the gate electrode 30p impurity diffused regions 36p which are to be lower-concentration regions of the LDD structure or shallow diffused regions of the extension source/drain structure (FIG. 5A).

Then, the photoresist film 34 is removed, and then a photoresist film 38 for covering the region for a p-channel MOS transistor to be formed in is formed by the photolithography technique.

Figure 5B:
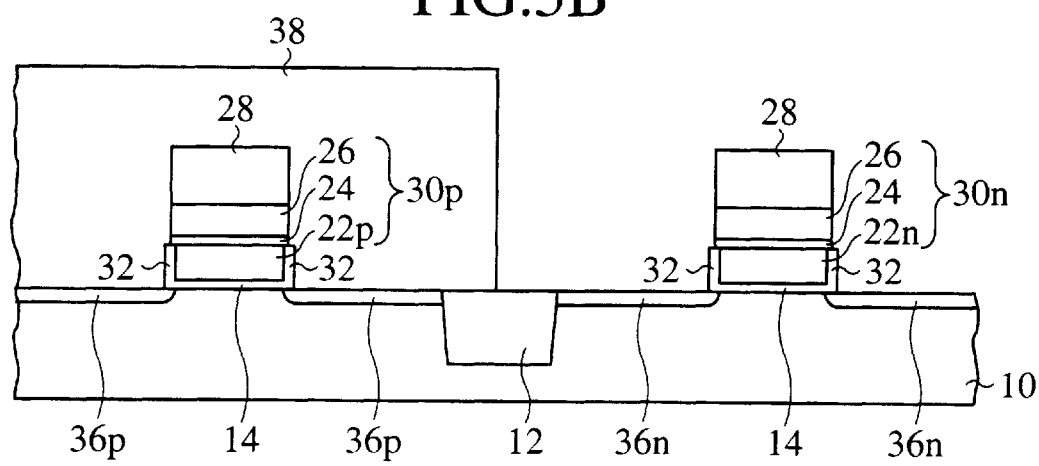

Next, with the photoresist film 38 and the gate electrode 30n as a mask, arsenic (As) ions are implanted at 20 keV acceleration energy and a $5 \times 10^{14}$ cm$^{-2}$ dose to form in the silicon substrate 10 on both sides of the gate electrode 30n impurity diffused regions 36n which are to be lower-concentration regions of the LDD structure or shallow diffused regions of the extension source/drain structure (FIG. 5B).

Then, after the photoresist film 38 has been removed, rapid thermal processing is performed for 10 seconds at 900° C. in a nitrogen atmosphere to activate the implanted dopant ions.

Figure 5C:
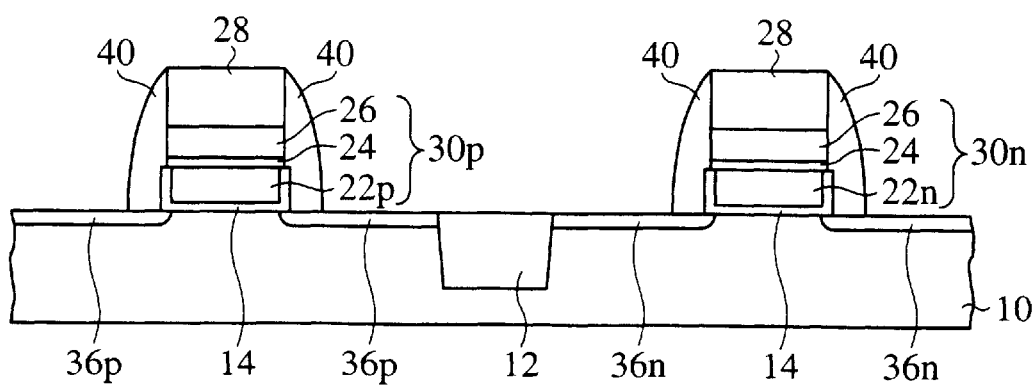

Then, a 20 nm-thick silicon nitride film is deposited on the entire surface by, e.g., CVD method and is etched back to form a sidewall insulation film 40 of the silicon nitride film on the side walls of the gate electrodes 30p, 30n and of the silicon nitride film 28 (FIG. 5C). At this time, film forming conditions for the silicon nitride film to be the sidewall insulation film 40 are set so that an Si—H bond concentration in the silicon nitride film immediately after deposited is below $4.3 \times 10^{20}$ cm$^{-3}$ measured by FT-IR. For example, the silicon nitride film can be formed at a 100 sccm SiH$_2$Cl$_2$ gas flow rate and a 1000 sccm NH$_3$ gas flow rate, a 780° C. -film forming temperature and at a 40 Pa pressure, whereby an Si—H bond concentration in the silicon nitride film can be below $4.3 \times 10^{10}$ cm$^{-3}$ measured by FT-IR.

Next, a photoresist film 42 for covering the region for an n-channel MOS transistor to be formed in is formed by the photolithography technique.

Figure 6A:
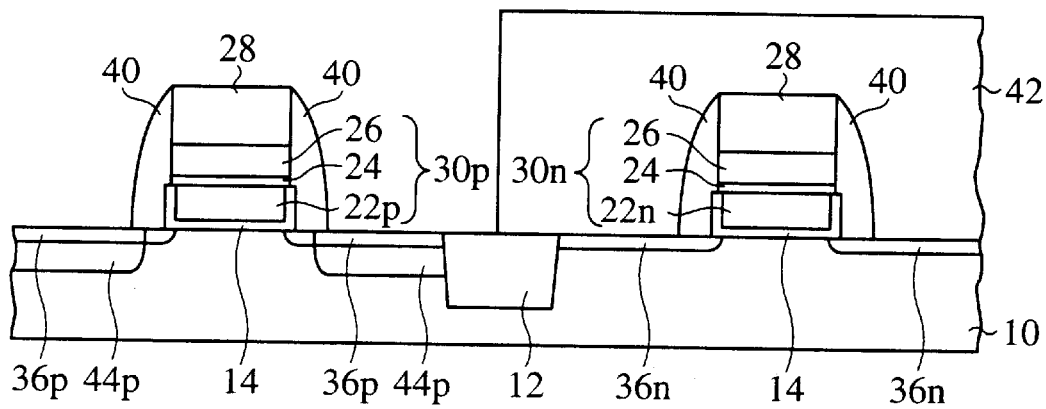

Then, with the photoresist film 42, the gate electrode 30p and the sidewall insulation film 40 as a mask, boron ions are implanted at 7 keV acceleration energy and a $3 \times 10^{15}$ cm$^{-2}$ dose to form impurity diffused regions 44p which are to be higher-concentration regions of the deep diffused regions of the source/drain structure (FIG. 6A).

Then, after the photoresist film 42 is removed, a photoresist film 46 for covering the region for a p-channel MOS transistor to be formed in is formed by the photolithography technique.

Figure 6B:
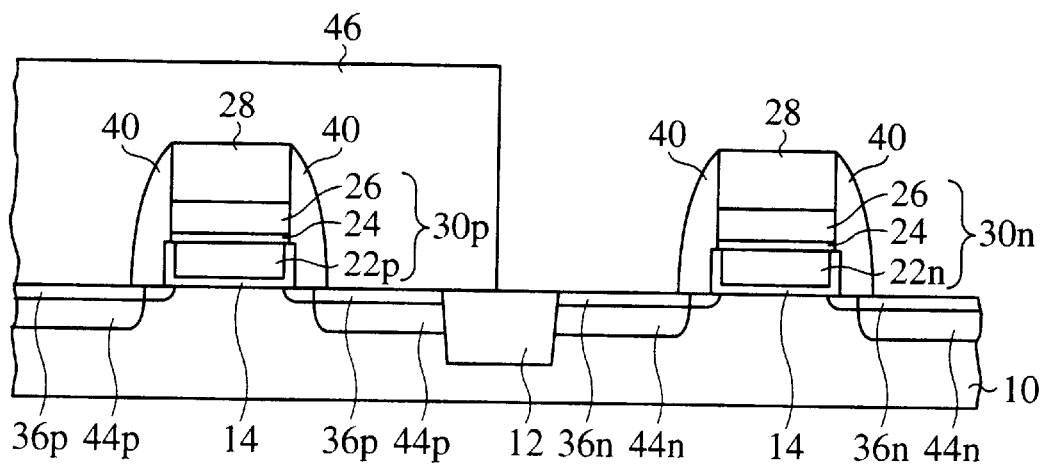

Next, with the photoresist film 46, the gate electrode 30n and the sidewall insulation film 40 as a mask, arsenic ions are implanted at 50 keV acceleration energy and at a $3 \times 10^{15}$ cm$^{-2}$ dose to form impurity diffused regions 44n which are to be higher-concentration regions of the deep diffused regions of the source/drain structure (FIG. 6B).

Figure 6C:
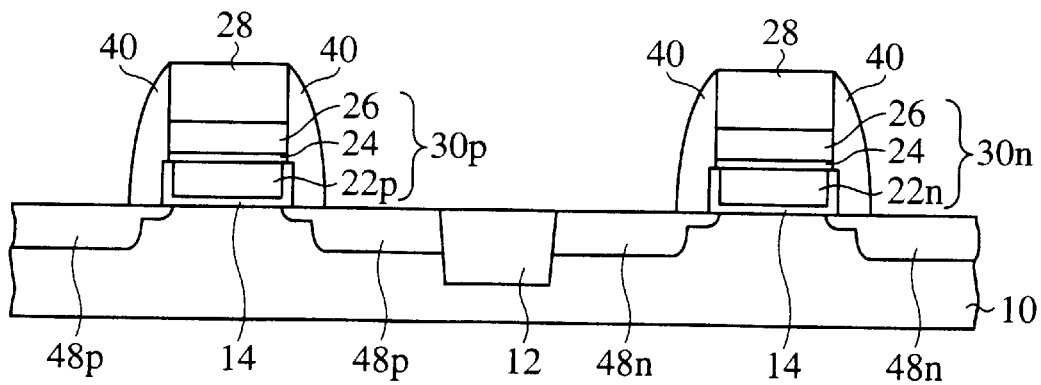

Then, after the photoresist film 46 is removed, thermal processing is performed in a nitrogen atmosphere, e.g., for 10 seconds at 950° C. to activate the implanted dopant ions to form a p-type source/drain diffused layer 48p of the dopant diffused regions 36p, 44p, and an n-type source/drain diffused layer 48n of the dopant diffused regions 36n, 44n (FIG. 6C).

Thus, a semiconductor device having dual gate electrodes 30p, 30n of the polymetal structure is fabricated.

A MOS transistor was fabricated by the above-described process in which the gate insulation film was provided by a silicon oxynitride film having an above 3% peak value of the nitrogen concentration in the film, and rapid thermal processing at above 950° C. was performed as the thermal processing for activating the source/drain diffused layer. In the MOS transistor, an Si—H bond concentration in the silicon nitride film immediately after deposited was set to be below $4.3 \times 10^{20}$ cm$^{-3}$ measured by FT-IR, whereby the boron penetration could be suppressed to a negligible level.

As described above, according to the present embodiment, the silicon nitride film forming the silicon nitride film 28 covering the upper surfaces of the gate electrodes 30p, 30n, and the silicon nitride film forming the sidewall insulation film 40 covering the side walls of the gate electrodes 30p, 30n are deposited under conditions which makes an Si—H bond concentration in the silicon nitride films immediately after deposited can be below $4.3 \times 10^{20}$ cm$^{-3}$ measured by FT-IR, whereby the release of hydrogen in the film in the thermal processing step following the formation of the silicon nitride films can be decreased, and the boron penetration from the p-type gate electrode 30p can be suppressed. Thus, a nitrogen concentration in the silicon oxynitride film forming the gate insulation film can be made low, whereby the boron penetration from the p-type gate electrode can be prevented without lowering driving performance of the n-channel MOS transistor.

[A Second Embodiment]

The method for fabricating the semiconductor device according to a second embodiment of the present invention will be explained with reference to FIGS. 7A–7D. The same members of the present embodiment as those of the method for fabricating the semiconductor device according to the first embodiment shown in FIGS. 3A–3D, 4A–4C, 5A–5C, and 6A–6C are represented by the same reference numbers not to repeat or to simplify their explanation.

FIGS. 7A–7D are sectional views of a semiconductor device in the steps of the method for fabricating the same according to the present embodiment, which show the method.

In the method for fabricating the semiconductor device according to the first embodiment, the present invention is applied to the fabrication of a semiconductor device having the so-called polymetal gate electrodes. However, the present invention is not limited to the semiconductor devices having the polymetal gate electrodes. In the present embodiment, the present invention is applied to a gate electrode formed of a single layer of polycrystalline silicon film.

First, a device isolation film 12 is formed of a silicon oxide film in a silicon substrate 10 by, e.g., shallow trench isolation technique.

Next, a p-well (not shown) is formed as required in a region for an n-channel MOS transistor to be formed in, and an n-well (not shown) is formed as required in a region for a p-channel MOS transistor to be formed in. Ion implantation for the control of a threshold voltage is performed in the regions for the respective transistors to be formed in.

Next, for example, a silicon oxide film as a base film is formed in an oxidizing atmosphere, and thermal processing of 900° C. is performed in an NO atmosphere to form a 4.5 nm-thick gate insulation film 14 of a silicon oxynitride film of a 3% nitrogen concentration on the silicon substrate 10 defined by the device isolation film 12.

Figure 7A:
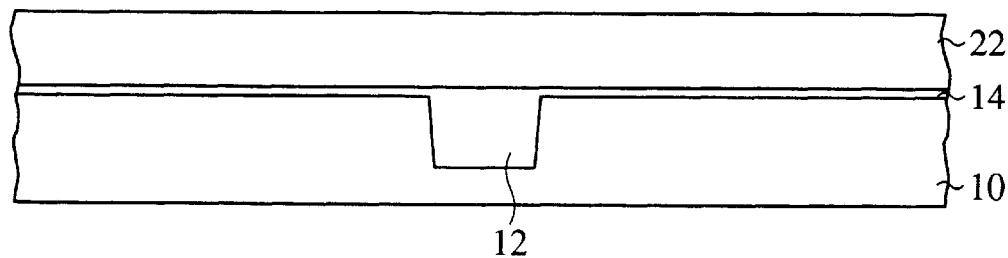
FIGS. 7A–7D are sectional views of a semiconductor device in the steps of the method for fabricating the same according to a second embodiment of the present invention, which show the method.

Then, a 200 nm-thick polycrystalline silicon film 22, for example, is formed on the gate insulation film 14 by, e.g., CVD method (FIG. 7A). For example, a polycrystalline silicon film is formed at a 620° C. film forming temperature by pyrolysis method using $SiH_4$ as a raw material gas.

Then, in the same way as, e.g., in the method for fabricating the semiconductor device according to the first embodiment shown in FIGS. 3C and 4A, p-type dopant ions are implanted into the polycrystalline silicon film 22 in the region for a p-channel MOS transistor to be formed in and n-type dopant ions are implanted into the polycrystalline silicon film 22 in the region for an n-channel MOS transistor to be formed in. In the region for a p-channel MOS transistor to be formed in, for example, boron ions are implanted at 5 keV acceleration energy and at a $3 \times 10^{15}$ cm$^{-2}$ dose. In the region for an n-channel MOS transistor to be formed in, for example, phosphorus ions are implanted at 10 keV acceleration energy and a $6 \times 10^{15}$ cm$^{-2}$ dose.

Next, thermal processing is performed, e.g., in a nitrogen atmosphere at 800° C. for 30 minutes to activate the boron and phosphorus implanted in the polycrystalline silicon film 22 to transform the polycrystalline silicon film 22 in the region for a p-channel MOS transistor to be formed in to a p-type polycrystalline silicon film 22p and the polycrystalline silicon film 22 in the region for an n-channel MOS transistor to be formed in to an n-type polycrystalline silicon film 22n.

Figure 7B:
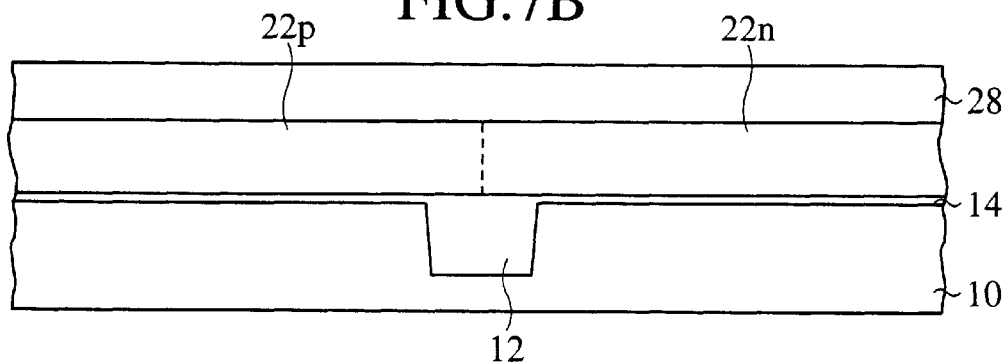

Next, a 100 nm-thick silicon nitride film 28 is formed on the polycrystalline silicon film 22p, 22n by, e.g., CVD method (FIG. 7B). At this time, film forming conditions are set so that an Si—H bond concentration in the silicon nitride film immediately after deposited is below $4.3 \times 10^{20}$ cm$^{-3}$ measured by FT-IR. The film is formed under conditions of, e.g., a 100 sccm $SiH_2Cl_2$ gas flow rate, a 1000 sccm $NH_3$ gas flow rate, a 780° C. film forming temperature and a 40 Pa pressure, whereby an Si—H bond concentration in the film can be below $4.3 \times 10^{20}$ cm$^{-3}$ measured by FT-IR.

Figure 7C:
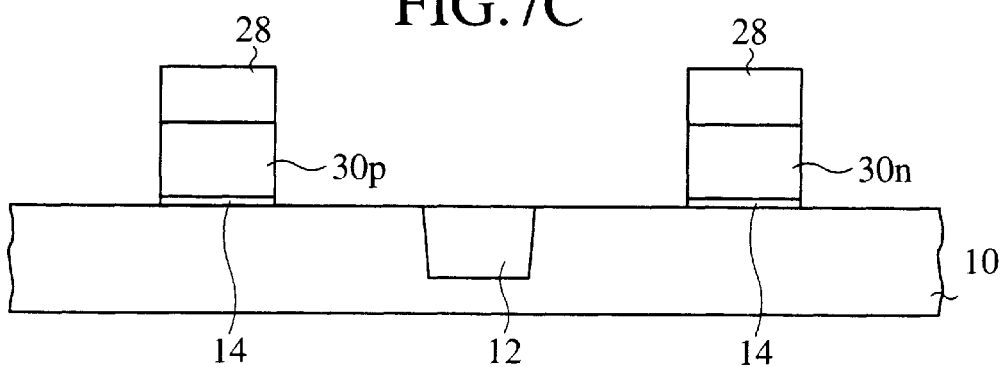

Then, the silicon nitride film 28 and the polycrystalline silicon film 22p, 22n are patterned by the photolithography and etching to form a p-type gate electrode 30p formed of the polycrystalline silicon film 22p having the upper surface covered by the silicon nitride film 28 in the region for a p-channel MOS transistor to be formed in, and an n-type gate electrode 30n formed of the polycrystalline silicon film 22n having the upper surface covered by the silicon nitride film 28 is formed in the region for an n-channel MOS transistor to be formed in (FIG. 7C).

Figure 7D:
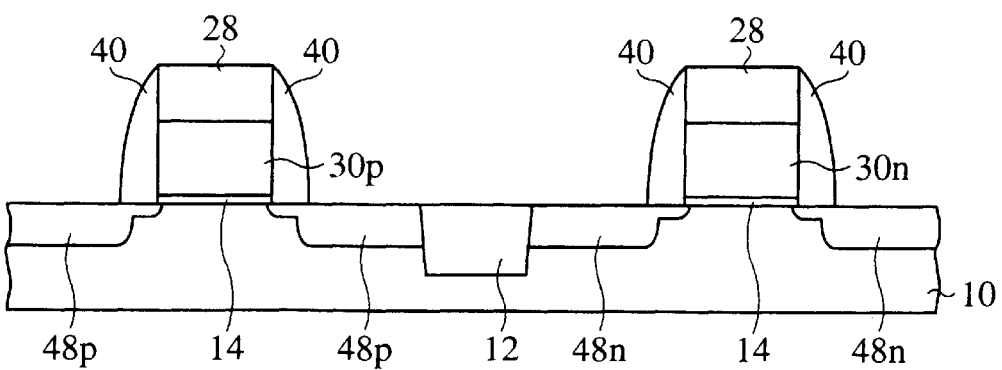

Next, in the same way as, e.g., in the method for fabricating the semiconductor device according to the first embodiment shown in FIGS. 5A to 6C, a sidewall insulation film 40 is formed on the side walls of the gate electrodes 30p, 30n of a silicon nitride film having an Si—H bond concentration of below $4.3 \times 10^{20}$ cm$^{-3}$ immediately after deposited, a p-type source/drain diffused layer 48p is formed in the silicon substrate 10 on both sides of the gate electrode 30p, and an n-type source/drain diffused layer 48n is formed in the silicon substrate 10 on both sides of the gate electrode 30n (FIG. 7D).

Thus, the semiconductor device having the dual gate electrodes 30p, 30n of the single polycrystalline silicon gate structure is fabricated.

As described above, according to the present embodiment, the silicon nitride film 28 covering the upper surfaces of the gate electrodes 30p, 30n, and the silicon nitride film forming the sidewall insulation film 40 covering the side walls of the gate electrodes 30p, 30n are deposited under conditions which allow an Si—H bond concentration in the silicon nitride films immediately after deposited is below $4.3 \times 10^{20}$ cm$^{-3}$, whereby release of hydrogen in the film in the thermal processing after the silicon nitride films have been formed can be decreased, and boron penetration from the p-type gate electrode 30p can be suppressed. Thus, a nitrogen concentration in the silicon oxynitride film forming the gate insulation film can be low, whereby the boron penetration from the p-type gate electrode can be prevented without lowering driving performance of the n-channel MOS transistor.

[A Third Embodiment]

The method for fabricating the semiconductor device according to a third embodiment of the present invention will be explained with reference to FIGS. 8A–8D. The same members of the present embodiment as those of the method for fabricating the semiconductor device according to the second and the third embodiments shown in FIGS. 3A–3D, 4A–4C, 5A–5C, 6A–6C, and 7A–7C are represented by the same reference numbers not to repeat or to simplify their explanation.

FIGS. 8A–8D are sectional views of the semiconductor device in the steps of the method for fabricating the same according to the present embodiment, which show the method.

In the above-described embodiments, the present invention is applied to a semiconductor device having the polymetal gate electrodes or the polycrystalline silicon gate electrodes. However, the present invention is not limited to a semiconductor devices having polymetal gate electrodes or polycrystalline silicon gate electrodes. In the present embodiment, the present invention is applied to polycide gate electrodes.

A device isolation film 12 is formed of a silicon oxide film in a silicon substrate 10 by, e.g., shallow trench isolation technique.

Next, a p-well (not shown) is formed as required in a region for an n-channel MOS transistor to be formed in, and an n-well (not shown) is formed as required in a region for a p-channel MOS transistor to be formed in. Ion implantation for controlling threshold voltages is performed in the respective regions for the transistors to be formed in.

Then, for example, a silicon oxide film as a base film is formed in an oxidizing atmosphere and, then thermal processing of 900° C. is performed in an NO atmosphere to form a gate insulation film 14 of a 4.5 nm-thick silicon oxynitride film having a 3% nitrogen concentration formed on the silicon substrate 10 defined by the device isolation film 12.

Figure 8A:
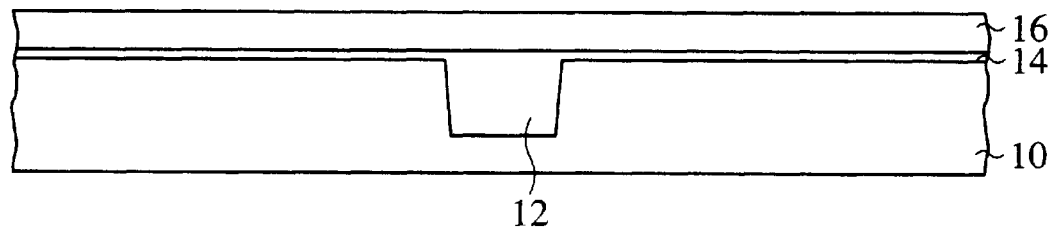
FIGS. 8A–8D are sectional views of a semiconductor device in the steps of the method for fabricating the same according to a third embodiment of the present invention, which show the method.

Next, a 700 nm-thick amorphous silicon film 16, for example, is formed on the gate insulation film 14 by, e.g., CVD method (FIG. 8A). For example, the amorphous silicon film 16 is formed at 540° C. by pyrolysis method using $SiH_4$ as a raw material gas.

Then, in the same way as, e.g., in the method for fabricating the semiconductor device according to the first embodiment shown in FIGS. 3C and 4C, p-type dopant ions are implanted into the amorphous silicon film 16 in the region for a p-channel MOS transistor to be formed in, and an n-type dopant ions are implanted in the amorphous silicon film 16 in the region for an n-channel MOS transistor to be formed in. In the region for a p-channel MOS transistor to be formed in, boron ions are implanted at 5 keV acceleration energy and at a $1.5 \times 10^{15}$ cm$^{-2}$ dose, and phosphorus ions are implanted at 10 keV acceleration energy and at a $5 \times 10^{15}$ cm$^{-2}$ dose in the region for an n-channel MOS transistor to be formed in.

Then, thermal processing is performed, e.g., in a nitrogen atmosphere at 800° C. for 30 minutes to crystallize the amorphous silicon film to a polycrystalline silicon film while activating the implanted boron and phosphorus ions to transform the amorphous silicon film 16 in the region for a p-channel MOS transistor to be formed in to a p-type polycrystalline silicon film 22p and the amorphous silicon film 16 in the region for an n-channel MOS transistor to be formed in to an n-type polycrystalline silicon film 22n.

Then, a 5 nm-thick tungsten nitride (WN) film 24 and a 100 nm-thick tungsten silicide (WSi$_2$) film 50 is formed sequentially on the polycrystalline silicon film 22p, 22n by, e.g., CVD method.

Figure 8B:
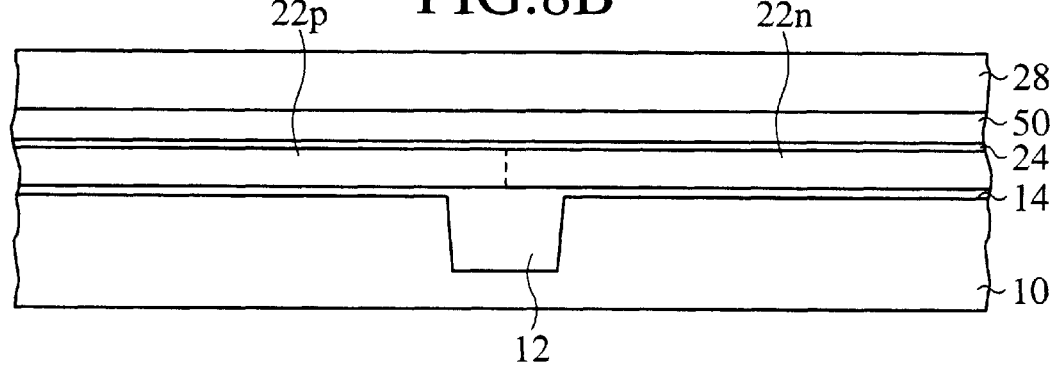

Then, a 100 nm-thick silicon nitride film 28 is formed on the tungsten silicide film 50 by, e.g., CVD method (FIG. 8B). At this time, film forming conditions are set so that an Si—H bond concentration in the silicon nitride film 28 is below $4.3 \times 10^{20}$ cm$^{-3}$ measured by FT-IR. The film is formed under conditions of, e.g., a 100 sccm SiH$_2$Cl$_2$ gas flow rate, a 1000 sccm NH$_3$ gas flow rate, a 780° C. film forming temperature and a 40 Pa pressure, whereby an Si—H bond concentration in the film can be below $4.3 \times 10^{20}$ cm$^{-3}$ measured by FT-IR.

Figure 8C:
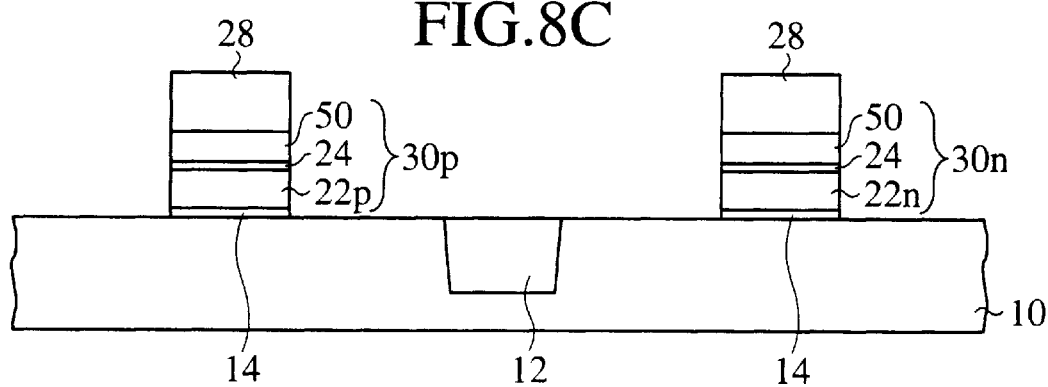

Next, the silicon nitride film 28, the tungsten silicide film 50, the tungsten nitride film 24 and the polycrystalline silicon film 22p, 22n are patterned by the photolithography and etching to form in the region for a p-channel MOS transistor to be formed in a p-type gate electrode 30p having the upper surface covered by the silicon nitride film 28 and formed of the layer film of the polycrystalline silicon film 22p, the tungsten nitride film 24 and the tungsten silicide film 50 and form in the region for an n-channel MOS transistor to be formed in an n-type gate electrode 30n having the upper surface covered by the silicon nitride film 28 and formed of the layer structure of the polycrystalline silicon film 22n, the tungsten nitride film 24 and the tungsten silicide film 50 (FIG. 8C).

Figure 8D:
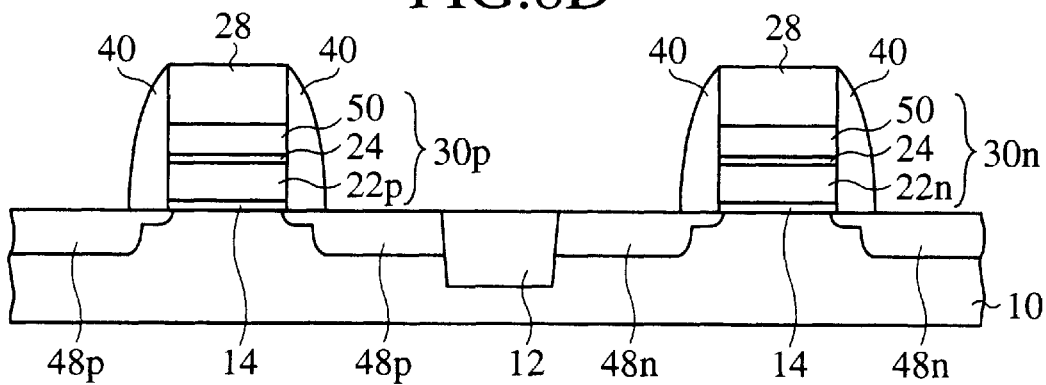

Then, in the same way as, e.g., in the method for fabricating the semiconductor device according to the first embodiment shown in FIGS. 5A to 6C, a sidewall insulation film 40 is formed on the side walls of the gate electrodes 30p, 30n of a silicon nitride film having a below $4.3 \times 10^{20}$ cm$^{-3}$ Si—H concentration immediately after deposited, a p-type source/drain diffused layer 48p formed in the silicon substrate 10 on both sides of the gate electrode 30p, and an n-type source/drain diffused layer 48n formed in the silicon substrate on both sides of the gate electrode 30n (FIG. 8D).

Thus, the semiconductor device having the dual gate electrodes 30p, 30n of the polycide structure is fabricated.

As described above, according to the present embodiment, the silicon nitride film 28 covering the upper surfaces of the gate electrodes 30p, 30n, and the silicon nitride film forming the sidewall insulation film 40 covering the side walls of the gate electrodes 30p, 30n are deposited under conditions which allow the films to have Si—H bond concentrations to be below $4.3 \times 10^{20}$ cm$^{-3}$ measured by FT-IR immediately after deposited, whereby the release of hydrogen in the films in the thermal processing after the silicon nitride films have been formed can be decreased, and the boron penetration from the p-type gate electrode 30p can be suppressed. Thus, a nitrogen concentration in the silicon oxynitride film forming the gate insulation film can be low, and the boron penetration from the p-type gate electrode can be prevented without lowering driving performance of the n-channel MOS transistor.

[Modifications]

The present invention is not limited to the above-described embodiments and covers other various modifications.

For example, in the above-described embodiments, SiH$_2$Cl$_2$ and NH$_3$ are used as raw materials to form the silicon nitride film covering the upper surfaces and the side walls of the gate electrodes, but the raw material gases for forming the silicon nitride film are not limited to such raw materials. For example, SiHCl$_3$ and NH$_3$, or SiCl$_4$ and NH$_3$ can be used as raw material gases.

In the first embodiment the present invention is applied to the dual gate electrodes of the polymetal structure, and in the third embodiment the present invention is applied to the dual gate electrodes of the polycide structure. The metal film and the silicide film forming the gate electrodes are not limited to tungsten film and tungsten silicide film described in the first and the third embodiments.

In the first to the third embodiments the insulation film covering the upper surfaces of the gate electrodes, and the sidewall insulation film are the single layer structure of silicon nitride film. However, the present invention is applied to a case in which the insulation film covering the upper surfaces of the gate electrodes, and the sidewall insulation film are formed of a layer film including silicon nitride film, whereby the boron penetration can be suppressed. The present invention can produce the effect even in a case that the insulation film covering the upper surfaces of the gate electrodes, and the sidewall insulation film have silicon oxide film on the lower side and silicon nitride film on the upper side.

The present invention is applied also to a case in which one of the insulation film on the gate electrodes, and the sidewall insulation film includes silicon nitride film.

What is claimed is:

1. A method for fabricating the semiconductor device comprising the steps of:

forming a gate insulation film on a semiconductor substrate;

forming on the gate insulation film a conducting film including a semiconductor film containing boron as an acceptor impurity in at least one region;

forming on the conducting film an insulation film including a silicon nitride film having an Si—H bond concentration immediately after deposited, which is below $4.3 \times 10^{20}$ cm$^{-3}$ measured by FT-IR; and patterning the insulation film and the conducting film to form a gate electrode of the conducting film having the upper surface covered by the insulation film, the silicon nitride film being formed by pyrolysis method at above 780° C. in a gas atmosphere containing dichlorosilane and ammonia with a flow rate ratio of the ammonia to the dichiorosilane above 10.

2. A method for fabricating the semiconductor device according to claim 1, further comprising the step of:

forming on the side wall of the gate electrode a sidewall insulation film including a silicon nitride film having an Si—H bond concentration immediately after deposited, which is below $4.3 \times 10^{20}$ cm$^{-3}$ measured by FT-IR, the silicon nitride film forming the sidewall insulation film being formed by pyrolysis method at above 780° C. in a gas atmosphere containing dichlorosilane and ammonia with a flow rate ratio of the ammonia to the dichlorosilane above 10.

3. A method for fabricating the semiconductor device according to claim 1, wherein in the step of forming a gate insulation film, the gate insulation film is formed of a silicon oxynitride film having a peak nitrogen concentration of above 3%.

4. A method for fabricating the semiconductor device according to claim 1, wherein the step of forming a gate electrode is followed by the step of performing thermal processing at above 950° C.

5. A method for fabricating the semiconductor device according to claim 1, wherein in the step of forming a conducting film, the conducting film is formed of a layer film including a silicon film containing boron, and a silicide film or a metal film.

6. A method for fabricating the semiconductor device according to claim 1, wherein in the step of forming a conducting film, the semiconductor film further including a region containing a donor impurity is formed.

7. A method for fabricating the semiconductor device according to claim 1, further comprising the step of:

forming on the side wall of the gate electrode a sidewall insulation film including a silicon nitride film having an Si—H bond concentration immediately after deposited, which is below $4.3 \times 10^{20}$ cm$^{-3}$ measured by FT-IR, the silicon nitride film forming the sidewall insulation film being formed by pyrolysis method in a gas atmosphere containing trichlorosilane or silicon tetrachloride and ammonia.

8. A method for fabricating the semiconductor device comprising the steps of:

forming a gate insulation film on a semiconductor substrate;

forming on the gate insulation film a conducting film including a semiconductor film containing boron as an acceptor impurity in at least one region;

patterning the conducting film to form a gate electrode of the conducting film; and forming on the side wall of the gate electrode a sidewall insulation film including a silicon nitride film having an Si—H bond concentration immediately after deposited, which is below $4.3 \times 10^{20}$ cm$^{-3}$ measured by FT-IR, the silicon nitride film being formed by pyrolysis method at above 780° C. in a gas atmosphere containing dichlorosilane and ammonia with a flow rate ratio of the ammonia to the dichlorosilane above 10.

9. A method for fabricating the semiconductor device according to claim 8, wherein in the step of forming a gate insulation film, the gate insulation film is formed of a silicon oxynitride film having a peak nitrogen concentration of above 3%.

10. A method for fabricating the semiconductor device according to claim 8, wherein the step of forming a gate electrode is followed by the step of performing thermal processing at above 950° C.

11. A method for fabricating the semiconductor device according to claim 8, wherein in the step of forming a conducting film, the conducting film is formed of a layer film including a silicon film containing boron, and a silicide film or a metal film.

12. A method for fabricating the semiconductor device according to claim 8, wherein in the step of forming a conducting film, the semiconductor film further including a region containing a donor impurity is formed.

* * * * *